(12) United States Patent
Murayama

(10) Patent No.: US 10,784,226 B2
(45) Date of Patent: Sep. 22, 2020

(54) SEMICONDUCTOR DEVICE

(71) Applicant: SHINKO ELECTRIC INDUSTRIES CO., LTD., Nagano-shi, Nagano-ken (JP)

(72) Inventor: Kei Murayama, Nagano (JP)

(73) Assignee: SHINKO ELECTRIC INDUSTRIES CO., LTD. (JP)

( * ) Notice: Subject to any disclaimer, the term of this patent is extended or adjusted under 35 U.S.C. 154(b) by 0 days.

(21) Appl. No.: 16/426,469

(22) Filed: May 30, 2019

(65) Prior Publication Data

US 2019/0371757 A1  Dec. 5, 2019

(30) Foreign Application Priority Data

Jun. 5, 2018 (JP) .................. 2018-107785

(51) Int. Cl.
| | |
|---|---|
| *H01L 23/48* | (2006.01) |
| *H01L 23/52* | (2006.01) |
| *H01L 29/40* | (2006.01) |
| *H01L 23/00* | (2006.01) |
| *H01L 23/31* | (2006.01) |
| *H01L 23/498* | (2006.01) |

(Continued)

(52) U.S. Cl.
CPC .......... *H01L 24/29* (2013.01); *H01L 21/4853* (2013.01); *H01L 21/565* (2013.01); *H01L 23/3121* (2013.01); *H01L 23/49844* (2013.01); *H01L 24/27* (2013.01); *H01L 24/73* (2013.01); *H01L 2224/27505* (2013.01); *H01L 2224/29076* (2013.01); *H01L 2224/29239* (2013.01); *H01L 2224/29247* (2013.01); *H01L 2224/29255* (2013.01); *H01L 2224/73265* (2013.01); *H01L 2924/10253* (2013.01); *H01L 2924/10272* (2013.01); *H01L 2924/1203* (2013.01); *H01L 2924/13055* (2013.01); *H01L 2924/13091* (2013.01)

(58) Field of Classification Search
CPC ............ H01L 2224/0332; H01L 23/12; H01L 21/4857; H01L 23/49822; H01L 23/49866; H01L 2224/27505; H01L 2224/8384
USPC ........................ 257/782, 783, 784
See application file for complete search history.

(56) References Cited

U.S. PATENT DOCUMENTS

| | | | | |
|---|---|---|---|---|
| 2007/0006452 A1* | 1/2007 | Egitto | ............. | H05K 3/462 29/832 |
| 2016/0141208 A1* | 5/2016 | Joachim | ............. | H01L 21/78 438/114 |

(Continued)

FOREIGN PATENT DOCUMENTS

JP     2018049932 A    3/2018

*Primary Examiner* — S. V. Clark
(74) *Attorney, Agent, or Firm* — Tarolli, Sundheim, Covell & Tummino LLP

(57) ABSTRACT

A semiconductor device includes an insulative substrate, a wiring pattern, a bonding portion, and a semiconductor element. The wiring pattern is formed on an upper surface of the insulative substrate. The bonding portion is formed on an upper surface of the wiring pattern. The semiconductor element includes an electrode pad connected to an upper surface of the bonding portion. The bonding portion includes first sintered layers distributed in the bonding portion and a second sintered layer having a density differing from each of the first sintered layers and surrounding the first sintered layer.

13 Claims, 7 Drawing Sheets

(51) Int. Cl.
    *H01L 21/48*     (2006.01)
    *H01L 21/56*     (2006.01)

(56) References Cited

U.S. PATENT DOCUMENTS

2016/0365323 A1* 12/2016 Viswanathan .......... H01L 29/16
2017/0012017 A1* 1/2017 Khazaka ................. H01L 24/29
2018/0190611 A1* 7/2018 Tatsumi .................. H01L 24/32

* cited by examiner

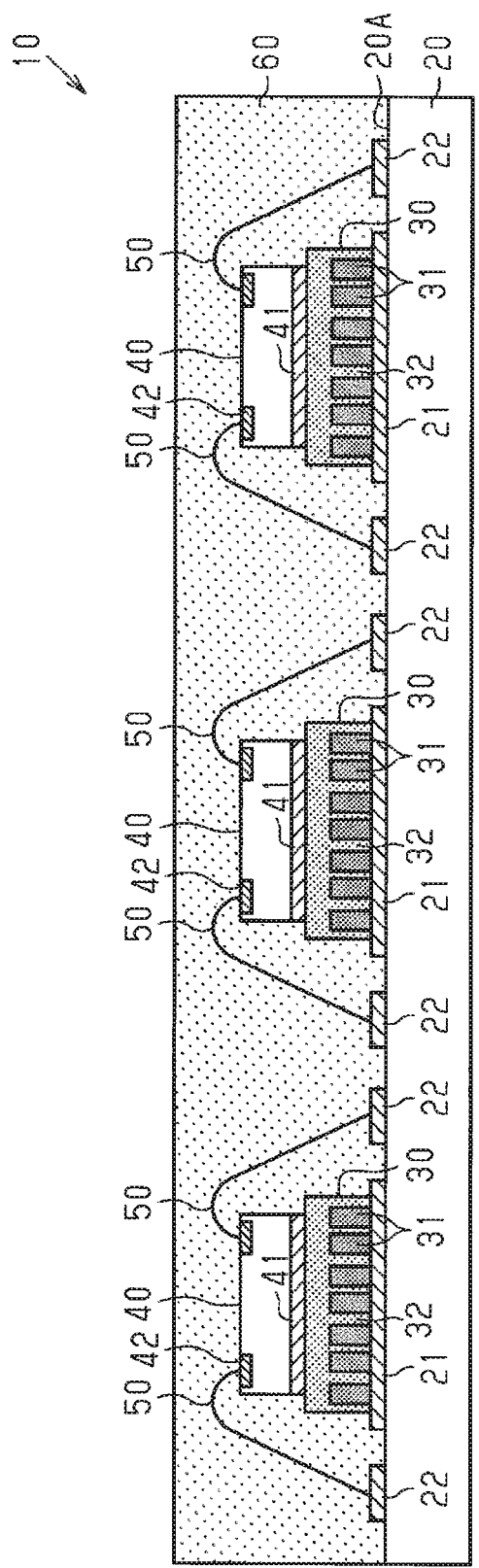

US 10,784,226 B2

SEMICONDUCTOR DEVICE

CROSS-REFERENCE TO RELATED APPLICATIONS

This application is based upon and claims the benefit of priority from prior Japanese Patent Application No. 2018-107785, filed on Jun. 5, 2018, the entire contents of which are incorporated herein by reference.

FIELD

This disclosure relates to a semiconductor device and a method for manufacturing a semiconductor device.

BACKGROUND

A semiconductor device that controls and supplies power is referred to as a power semiconductor device (power module). This type of semiconductor device includes a bonding portion that bonds a wiring pattern formed on an upper surface of an insulative substrate and an electrode pad formed on a lower surface of a semiconductor element. The bonding portion is formed from a sintering material having silver (Ag) as a main component (refer to Japanese Laid-Open Patent Publication No. 2018-49932).

As sintering of metal particles progresses in the bonding portion formed from the sintering material, a large number of voids gather in a region proximate to the periphery of the bonding portion. This lowers the connection reliability between the semiconductor element and the insulative substrate at the peripheral region.

SUMMARY

A semiconductor device in accordance with one embodiment of includes an insulative substrate, a wiring pattern, a bonding portion, and a semiconductor element. The wiring pattern is formed on an upper surface of the insulative substrate. The bonding portion is formed on an upper surface of the wiring pattern. The semiconductor element includes an electrode pad bonded to an upper surface of the bonding portion. The bonding portion includes first sintered layers distributed in the bonding portion and a second sintered layer having a density differing from that of each of the first sintered layers and surrounding the first sintered layer.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 6 is a schematic cross-sectional view of a semiconductor device of a modified example.

DESCRIPTION OF THE EMBODIMENTS

Figure 1A:
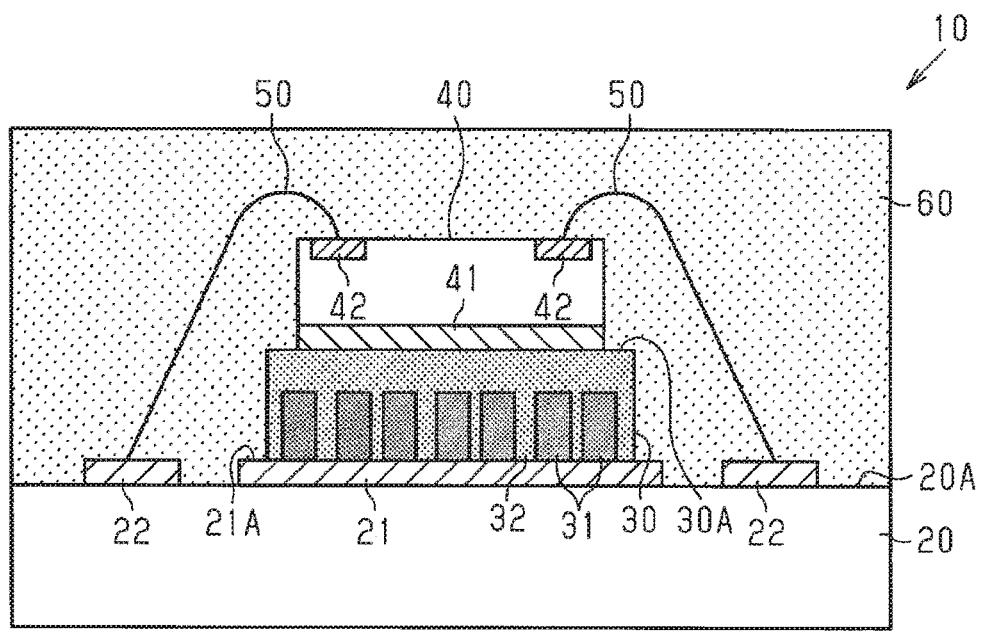
FIG. 1A is a schematic cross-sectional view of a semiconductor device in accordance with one embodiment.

Embodiments will now be described with reference to the drawings. The drawings may not be to scale, and the relative size, proportions, and depiction of elements in the drawings may be exaggerated for clarity, illustration, and convenience. Moreover, to facilitate understanding, hatching lines may not be illustrated or be replaced by shadings in the cross-sectional drawings.

A semiconductor device 10 will now be described with reference to FIG. 1A.

The semiconductor device 10 is, for example, a power semiconductor device (power module) that controls and supplies power. The semiconductor device 10 includes an insulative substrate 20, a wiring pattern 21, a bonding portion 30, and a semiconductor element 40. The wiring pattern 21 is formed on an upper surface 20A of the insulative substrate 20. The bonding portion 30 is formed on an upper surface 21A of the wiring pattern 21. The semiconductor element 40 includes an electrode pad 41 that is connected to an upper surface 30A of the bonding portion 30.

The insulative substrate 20 is, for example, a ceramic substrate formed from a ceramic such as an alumina. The upper surface 20A of the insulative substrate 20 includes the wiring pattern 21 and a plurality of wiring patterns 22 (two in FIG. 1A). The wiring pattern 21 is larger than each wiring pattern 22 in a plan view. The material of the wiring patterns 21 and 22 may be, for example, copper (Cu) or a copper alloy. In the present description, "plan view" refers to a view of a subject taken in a direction orthogonal to the upper surface 20A of the insulative substrate 20. Further, "planar shape" refers to a shape of a subject in a plan view.

A surface-processed layer may be formed on the surfaces of the wiring patterns 21 and 22 (e.g., only on upper surfaces or on upper surfaces and side surfaces) when necessary. Examples of the surface-processed layer includes a gold (Au) layer, a nickel (Ni) layer/Au layer (metal layer in which Ni layer and Au layer are sequentially stacked with Ni layer serving as bottom layer), and a Ni layer/palladium (Pd) layer/Au layer (metal layer in which Ni layer, Pd layer, and Au layer are sequentially stacked with Ni layer serving as bottom layer). The Au layer, Ni layer, and Pd layer may each be, for example, an electroless plating metal layer formed in an electroless plating process. The Au layer is a metal layer of Au or an Au alloy. The Ni layer is a metal layer of Ni or a Ni alloy. The Pd layer is a metal layer of Pd or a Pd alloy.

The bonding portion 30 is formed on the upper surface 21A of the wiring pattern 21. The bonding portion 30 is bonded to the wiring pattern 21 and the electrode pad 41 of the semiconductor element 40 to electrically connect the wiring pattern 21 to the electrode pad 41. The bonding portion 30 may have a thickness of, for example, approximately 20 to 80 μm.

The semiconductor element 40 is formed from, for example, silicon (Si) or a silicon carbide (SiC). The semiconductor element 40 is, for example, a power semiconductor element. For example, an insulated gate bipolar transistor (IGBT), a metal-oxide-semiconductor field-effect transistor (MOSFET), or a diode may be used as the semiconductor element 40. The semiconductor element 40 has a planar shape that is, for example, rectangular. The semiconductor element 40 may have a dimension of, for example, approximately 10 mm×10 mm in a plan view. The semiconductor element 40 may have a thickness of, for example, approximately 50 to 200 μm.

The electrode pad 41 is formed on the lower surface of the semiconductor element 40. The lower surface of the electrode pad 41 is bonded to the upper surface 30A of the bonding portion 30. The material of the electrode pad 41 may be a metal such as aluminum (Al) or copper. Alternatively, the material of the electrode pad 41 may be an alloy including at least one selected from a metal such as aluminum or copper.

A surface processed-layer may be formed on the surfaces of the electrode pad 41 (e.g., only on lower surface or on lower surface and side surface) when necessary. Examples of the surface-processed layer include an Au layer, Ni layer/Au layer, and Ni layer/Pd layer/Au layer.

The upper surface of the semiconductor element 40 includes, for example, a plurality of electrode pads 42 (two in FIG. 1A). Each of the electrode pads 42 is electrically connected to the corresponding wiring pattern 22 of the insulative substrate 20 by a conductive wire 50. The material of the electrode pads 42 may be a metal such as aluminum or copper. Alternatively, the material of the electrode pads 42 may be an alloy including at least one selected from a metal such as aluminum or copper. A thin line of gold, copper, or aluminum may be used as the wire 50.

The semiconductor device 10 includes an encapsulation resin 60 formed on the upper surface 20A of the insulative substrate 20 to encapsulate the semiconductor element 40 and the wires 50. The encapsulation resin 60, for example, entirely covers the semiconductor element 40, the wires 50, the bonding portion 30, and the wiring patterns 21 and 22.

The material of the encapsulation resin 60 may be, for example, a non-photosensitive insulative resin having thermosetting resin as a main component. The material of the encapsulation resin 60 may be an insulative resin such as an epoxy resin or a polyimide resin. Alternatively, the material of the encapsulation resin 60 may be a resin material obtained by mixing such an insulative resin with a filler such as silica or alumina. For example, a mold resin may be used as the encapsulation resin 60.

The structure of the bonding portion 30 will now be described in detail.

The bonding portion 30 includes sintered layers 31 and a sintered layer 32. The sintered layers 31 are distributed in the bonding portion 30. The sintered layer 32, which has a density (e.g., density of sintered body) differing from that of the sintered layers 31, surrounds the sintered layers 31. The sintered layers 31 and 32 are formed from a metal sintering material. The material of the sintered layers 31 and 32 may be a sintering material having silver (Ag) particles (silver sintering material) as a main component or a sintering material having copper particles (copper sintering material) as a main component. The sintered layers 31 and 32 may include metal particles (e.g., nickel particles) other than the metal particles of the main component. In the present example, the sintered layers 31 and 32 are formed from a silver sintering material. That is, the sintered layers 31 and 32 of the present example are formed from the same sintering material. The density (sintered density) of the sintered layers 31 differs from that of the sintered layer 32. The difference in density forms an interface between each sintered layer 31 and the sintered layer 32. In the present example, the sintered layers 31 are formed to have a density higher than the sintered layer 32. In other words, the sintered layers 31 are formed to be denser than the sintered layer 32.

Figure 1B:
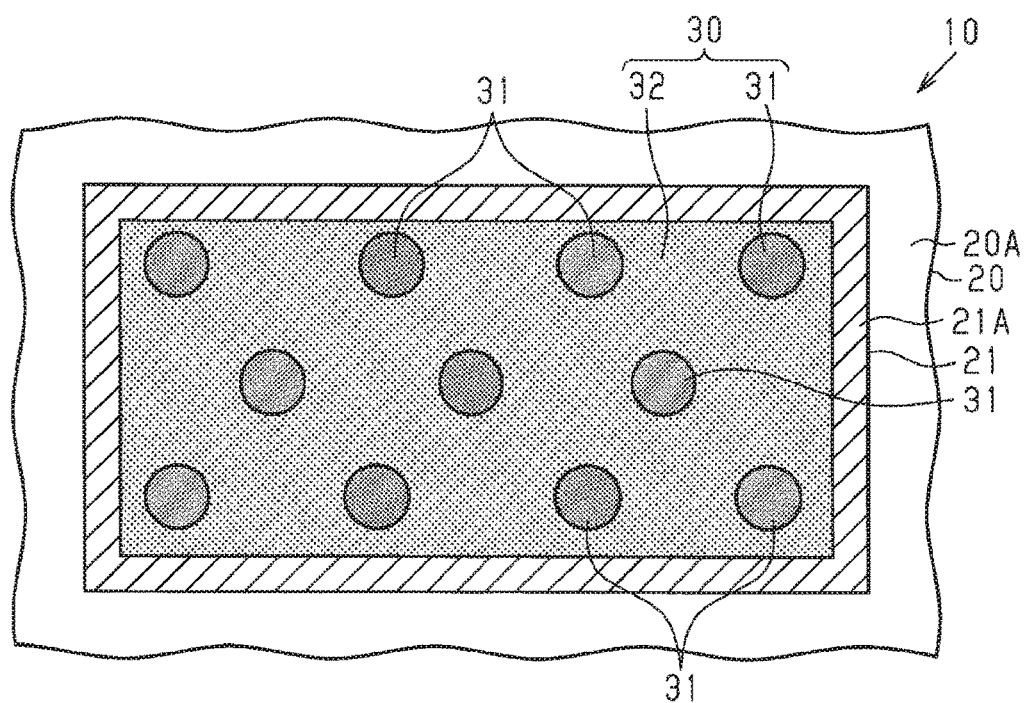
FIG. 1B is a schematic plan view of part of the semiconductor device illustrated in FIG. 1A.

As illustrated in FIG. 1B, the sintered layers 31 are, for example, arranged distributed in the bonding portion 30 in a planar direction (direction orthogonal to thickness-wise direction of bonding portion 30). For example, the sintered layers 31 are arranged near corners of the bonding portion 30 in a plan view. For example, the sintered layers 31 are distributed in a peripheral region and a central region of the bonding portion 30 in a plan view. The sintered layers 31 may each have any planar shape and size. For example, the sintered layers 31 may each have a circular planar shape with a diameter of approximately 50 to 100 μm. FIG. 1B is a plan view taken from above and through the sintered layer 32, which is formed on the upper surfaces of the sintered layers 31, illustrating the bonding portion 30 and part of the insulative substrate 20 of FIG. 1A.

As illustrated in FIG. 1A, the sintered layers 31 are, for example, formed on and contact the upper surface 21A of the wiring pattern 21. In the present example, the sintered layers 31 are bonded to the upper surface 21A of the wiring pattern 21. Each of the sintered layers 31 is, for example, post-like and extends upward from the upper surface 21A of the wiring pattern 21. Each of the sintered layers 31 may have a thickness of, for example, approximately 10 to 60 μm.

The sintered layer 32 is, for example, formed on and contacts the upper surface 21A of the wiring pattern 21. In the present example, the sintered layer 32 is bonded to the upper surface 21A of the wiring pattern 21. The sintered layer 32 entirely covers the side surfaces and upper surfaces of the sintered layers 31. Thus, the upper surface 30A and the side surfaces of the bonding portion 30 in the present example are formed only by the sintered layer 32. Further, the upper surfaces and the side surfaces of the sintered layers 31 are not exposed to the outside. The sintered layer 32 may have a thickness of, for example, approximately 20 to 80 μm. Further, the sintered layer 32 may have a thickness between the upper surfaces of the sintered layers 31 and the upper surface of the sintered layer 32 of, for example, approximately 10 to 25 μm.

As illustrated in FIG. 1B, the sintered layer 32 fills the gap between adjacent sintered layers 31. The sintered layer 32 may have any planar shape and size. For example, the planar shape of the sintered layer 32 may be the same as the planar shapes of the wiring pattern 21 and the electrode pad 41 of the semiconductor element 40 (refer to FIG. 1A, rectangular in present example). The sintered layer 32 has a size (external dimensions) that is, for example, slightly smaller than the external dimensions of the wiring pattern 21 in a plan view.

The bonding portion 30 has a sea-island structure in which the sintered layer 32 forms the sea portion and the sintered layers 31 form the island portions.

A method for manufacturing a semiconductor device of the related art will now be described before describing a method for manufacturing of the semiconductor device 10.

Figure 7A:
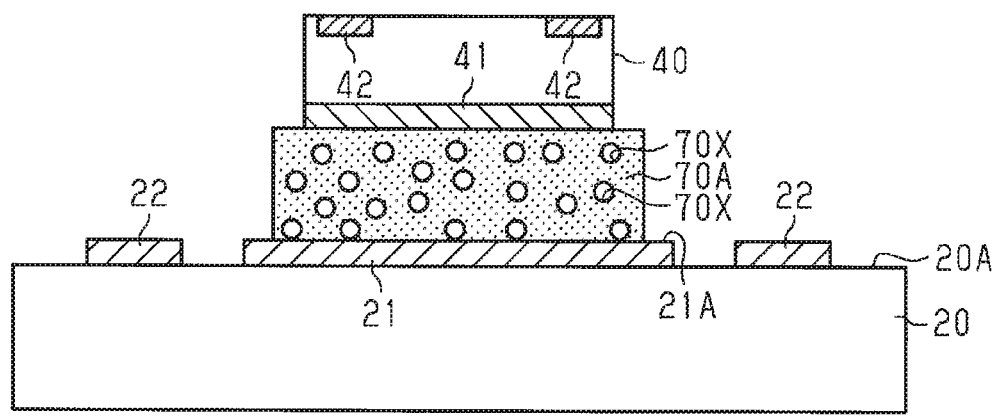
FIGS. 7A and 7B are schematic cross-sectional views illustrating a method for manufacturing a related art semiconductor device.

As illustrated in FIG. 7A, a sintering material 70A is formed on the upper surface 21A of the wiring pattern 21. The sintering material 70A is formed as a solid on the upper surface 21A of the wiring pattern 21. The sintering material 70A may have a thickness of, for example, approximately 30 to 40 μm. The sintering material 70A includes a large number of voids 70X. The sintering material 70A may be formed, for example, by applying a silver sintering paste, which is obtained by dispersing silver particles in an organic solvent, on the upper surface 21A of the wiring pattern 21 through a printing method.

Next, the semiconductor element 40 is placed on the upper surface of the sintering material 70A. In the example illustrated in FIG. 7A, the electrode pad 41, which is formed on the lower surface of the semiconductor element 40, contacts the upper surface of the sintering material 70A.

Figure 7B:
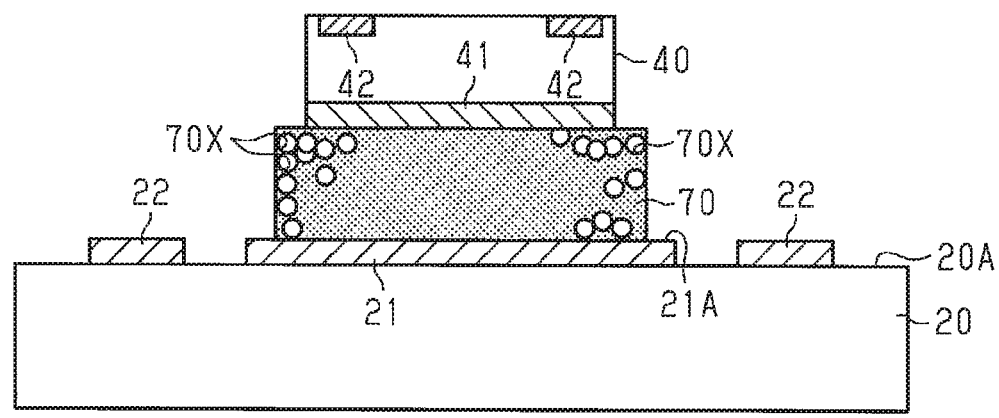

In the step illustrated in FIG. 7B, the sintering material 70A is heated and sintered in a state in which the semiconductor element 40 is pressed toward the wiring pattern 21. This forms a bonding portion 70 that bonds the wiring pattern 21 and the electrode pad 41. In the sintering process, as sintering of the metal particles (here, silver particles) included in the sintering material 70A progresses during the pressing and heating process, the metal particles are joined with one another. This reduces the size of the voids 70X between the metal particles and eliminates some of the voids 70X from the sintering material 70A. The contraction and elimination of the voids 70X decrease the amount of the voids 70X in the bonding portion 70 and densify the bonding portion 70 (sintered body). However, in the bonding portion 70 of the related art, as sintering of the metal particles progresses, the voids 70X gather in the peripheral region of the bonding portion 70. Such voids 70X are not eliminated from the sintering material 70A and remain in the bonding portion 70. Thus, the large number of residual voids 70X combine to form large voids (that is, a sparse sintered portion having low metal particle density) in the peripheral region of the bonding portion 70. The formation of such large voids in the bonding portion 70 lowers the connection reliability between the wiring pattern 21 and the electrode pad 41.

Further, the bonding portion 70 entirely contracts and densifies at the same time. The contraction of the bonding portion 70 applies stress to the interface of the bonding portion 70 and the electrode pad 41 and may crack the bonding portion 70 at the interface.

A method for manufacturing the semiconductor device 10 will now be described. To facilitate understanding, elements ultimately included in the semiconductor device 10 are denoted by the same reference characters throughout the drawings.

Figure 2A:
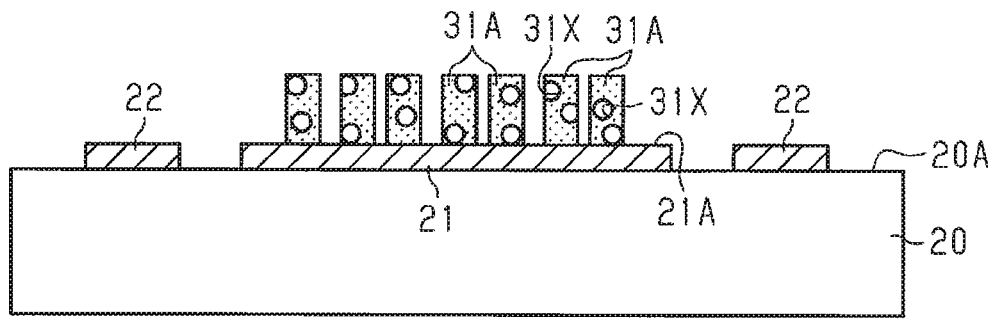
FIG. 2A is a schematic cross-sectional view illustrating a method for manufacturing the semiconductor device illustrated in FIG. 1A.

First, as illustrated in FIG. 2A, the insulative substrate 20 that includes the wiring patterns 21 and 22 on the upper surface 20A is prepared.

Figure 2B:
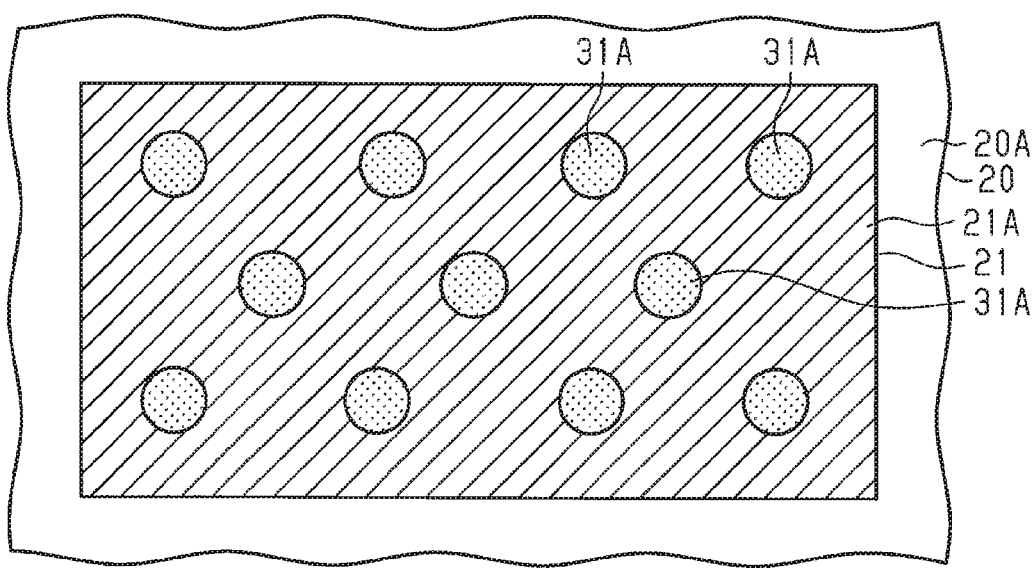
FIG. 2B is a schematic plan view of part of the structure illustrated in FIG. 2A.

Then, as illustrated in FIGS. 2A and 2B, sintering materials 31A that are precursors of the sintered layers 31 (refer to FIGS. 1A and 1B) are formed distributed on the upper surface 21A of the wiring pattern 21. As illustrated in FIG. 2A, each of the sintering materials 31A is post-like and extends upward from the upper surface 21A of the wiring pattern 21. Each sintering material 31A includes many voids 31X. The sintering materials 31A may be formed, for example, by applying a paste of sintering material (sintering paste) on the upper surface 21A of the wiring pattern 21 through a printing process or a dispenser process. For example, a silver sintering paste, which is obtained by dispersing silver particles in an organic solvent, may be used as a sintering paste. For example, a screen printing process or a stencil printing process may be employed as the printing method.

Figure 2C:
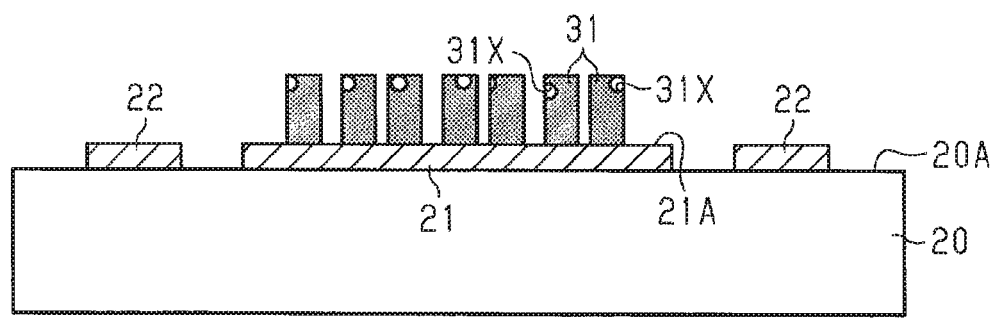
FIGS. 2C and 3A are schematic cross-sectional views illustrating the method for manufacturing the semiconductor device following the step illustrated in FIG. 2A.

In the step illustrated in FIG. 2C, the sintering materials 31A illustrated in FIGS. 2A and 2B are heated and sintered to form the sintered layers 31. For example, when the silver sintering paste is used as the sintering materials 31A, the heating temperature may be approximately 180° C. to 300° C. When the sintering process is performed for the first time, metal particles are joined with one another as sintering of the metal particles (here, silver particles) included in the sintering materials 31A progresses in the heating process. As a result, the voids 31X between the metal particles are reduced in size and some of the voids 31X are eliminated from the sintering materials 31A. The contraction and elimination of the voids 31X decrease the amount of the voids 31X in the sintered layers 31. Thus, the density of the sintered layers 31 becomes higher than the density of the sintering materials 31A prior to the sintering (that is, sintered layers 31 are densified). In this case, as sintering of the metal particles in each sintered layer 31 progresses, the voids 31X move toward the peripheral region in the sintered layer 31. The sintered layers 31 are distributed on the upper surface 21A of the wiring pattern 21, and the volume of each sintered layer 31 is significantly smaller than the total volume of the bonding portion 70 in the related art (refer to FIG. 7B). Thus, even when each sintering material 31A includes the voids 31X at a central portion prior to the sintering, the voids 31X are effectively eliminated from the sintered layer 31. This effectively reduces the amount of the residual voids 31X inside the sintered layer 31. Each sintered layer 31 is simultaneously reduced in size and densified.

Figure 3A:
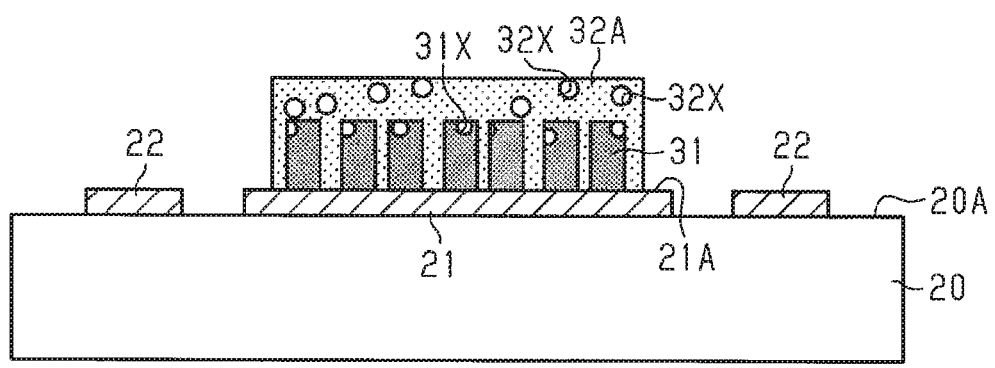
Figure 3B:
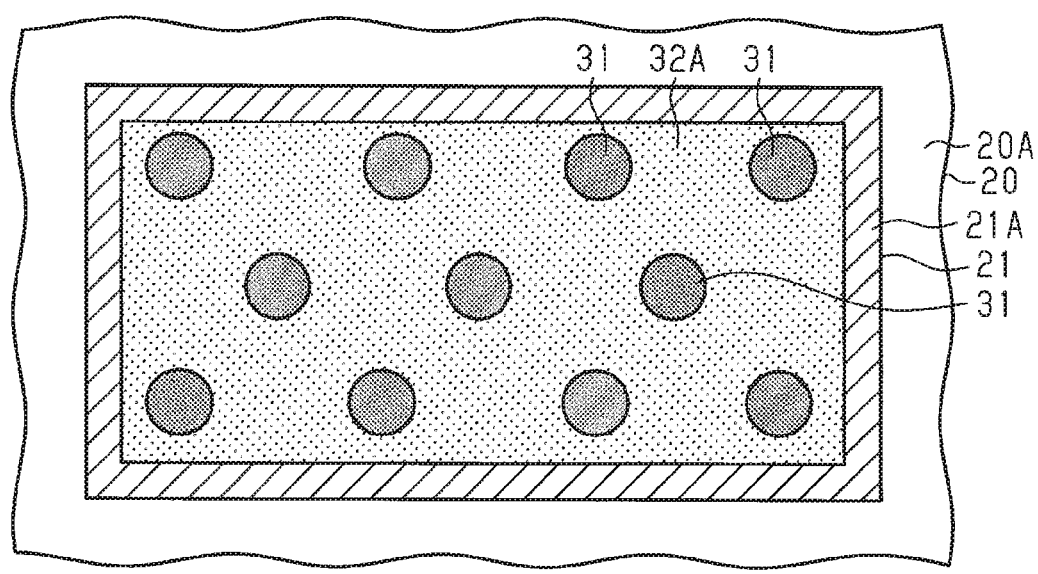
FIG. 3B is a schematic plan view of part of the structure illustrated in FIG. 3A.

In the step illustrated in FIGS. 3A and 3B, a sintering material 32A, which is a precursor of the sintered layer 32 (refer to FIGS. 1A and 1B), is formed covering the sintered layers 31 on the upper surface 21A of the wiring pattern 21. As illustrated in FIG. 3A, the sintering material 32A entirely covers the upper surfaces and side surfaces of the sintered layers 31. The gaps between adjacent sintered layers 31 are filled with the sintering material 32A. The sintering material 32A includes many voids 32X. The sintering material 32A may be formed, for example by applying a sintering paste (e.g., silver sintering paste) onto the upper surface 21A of the wiring pattern 21 through a printing process or a dispenser process. For example, a screen printing process or a stencil printing process may be employed as the printing process. When forming the sintering material 32A, the voids 31X exposed from the surfaces of the sintered layers 31 may be filled with the sintering paste. In this manner, the voids 31X exposed from the surfaces of the sintered layers 31 are reduced in size or eliminated.

Subsequently, in the step illustrated in FIG. 4A, the semiconductor element 40 is placed on the upper surface of the sintering material 32A so that the electrode pad 41 formed on the lower surface of the semiconductor element 40 (or surface-processed layer formed on surface of electrode pad 41) contacts the upper surface of the sintering material 32A.

Figure 4A:
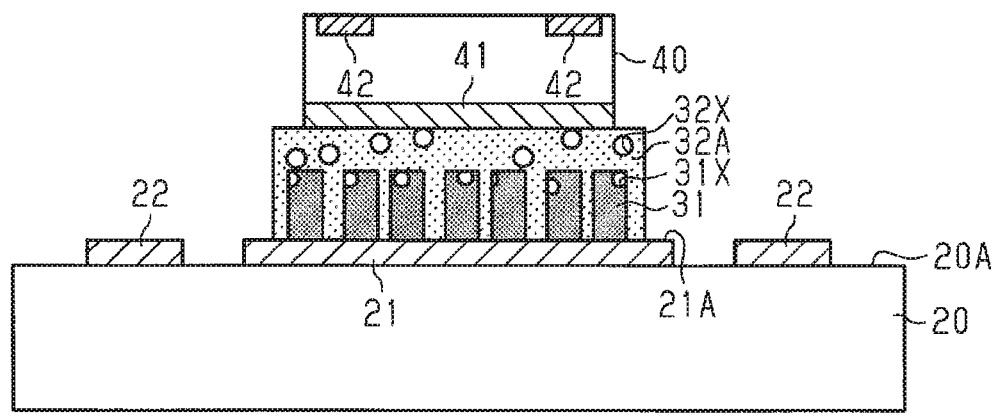
FIGS. 4A, 4B, 5A, and 5B are schematic cross-sectional views illustrating the method for manufacturing the semiconductor device following the step illustrated in FIG. 3A.
Figure 4B:
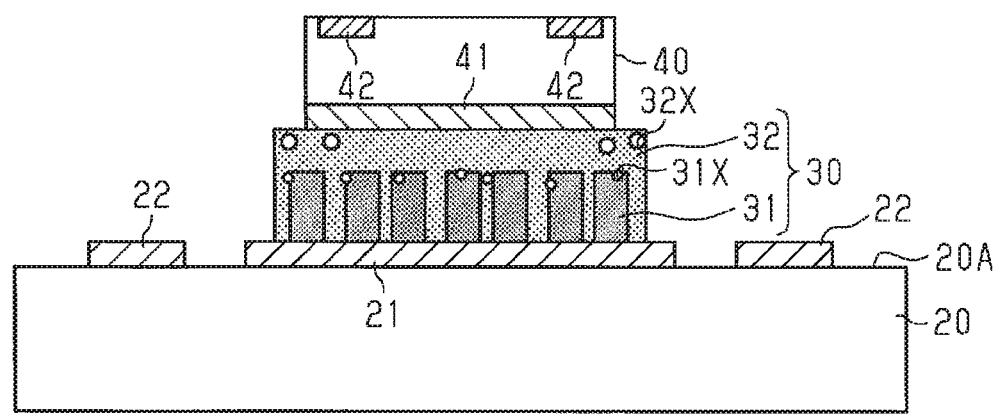

Then, in the step illustrated in FIG. 4B, the sintering material 32A illustrated in FIG. 4A is heated and sintered to form the sintered layer 32. This forms the bonding portion 30, which includes the sintered layers 31 and the sintered layer 32 and bonds the electrode pad 41 and the wiring pattern 21.

For example, the sintering material 32A is heated and sintered in a state in which the semiconductor element 40 is pressed toward the wiring pattern 21 to form the sintered layer 32 (bonding portion 30). When a silver sintering paste is used as the sintering material 32A, the heating temperature may be, for example, approximately 180° C. to 300° C. When the sintering process (that is, step forming sintered layer 32) is performed for the second time, metal particles are joined with one another as sintering of the metal particles (here, silver particles) included in the sintering material 32A progresses in the pressing and heating process. As a result, the voids 32X between the metal particles are reduced in size and some of the voids 32X are eliminated from the sintering material 32A. The contraction and elimination of the voids 32X decreases the amount of the voids 32X in the sintered layer 32. Thus, the density of the sintered layer 32 becomes higher than the density of the sintering material 32A prior to the sintering (that is, sintered layer 32 is densified). Further, in the second sintering process, the sintered layers 31 are heated simultaneously with the sintering material 32A illustrated in FIG. 4A. Thus, the metal particles are also sintered in the sintered layers 31. Accordingly, the voids 31X of the sintered layers 31 are further contracted and eliminated, and the sintered layers 31 are further densified. In this manner, the sintered layers 31 that undergo the heating process (sintering process) twice become denser than the sintered layer 32 that undergoes the heating process (sintering process) once.

In the process forming the sintered layer 32, as sintering of the metal particles progresses, the voids 32X move toward the peripheral region of the sintered layer 32. As illustrated in FIG. 4B, some of the voids 32X moved toward the peripheral region of the sintered layer 32 are not eliminated from the sintered layer 32 and remain inside the sintered layer 32. However, some of the voids 31X (e.g., some of voids 31X located in central region of bonding portion 30) have been eliminated from the sintered layers 31 during the first sintering process. Thus, as illustrated in FIG. 4A, the amount of the voids 31X and 32X included in the sintered layers 31 and the sintering material 32A when forming the sintering material 32A is less than the amount of the voids 70X included in the related art sintering material 70A (refer to FIG. 7A). Referring to FIG. 4B, this avoids situations in which a number of voids 32X gathered at the peripheral region of the bonding portion 30 combine to form large voids (that is, sparse sintered portion having low metal particle density) after the second sintering process.

Further, in the process forming the sintered layer 32, the bonding portion 30 entirely contracts as the sintered layers 31 and 32 densify. In this case, the sintered layers 31 are densified during the first sintering process and subtly contracted during the second sintering process. Thus, the second sintering process mainly contracts the sintered layer 32 of the bonding portion 30. Accordingly, the region (volume) contracted by the second sintering process is smaller than that of the bonding portion 70 in the related art that is sintered in a single sintering process. This reduces the stress applied by the sintering process to the interface of the bonding portion 30 and the electrode pad 41 of the semiconductor element 40 and limits the formation of a crack in the bonding portion 30 at the interface.

The steps illustrated in FIGS. 2A to 4B form the bonding portion 30 bonding the wiring pattern 21 of the insulative substrate 20 and the semiconductor element 40.

Subsequently, in the step illustrated in FIG. 5A, the electrode pads 42 formed on the upper surface of the semiconductor element 40 are electrically connected to the wiring patterns 22 of the insulative substrate 20 by the wires 50.

Figure 5A:
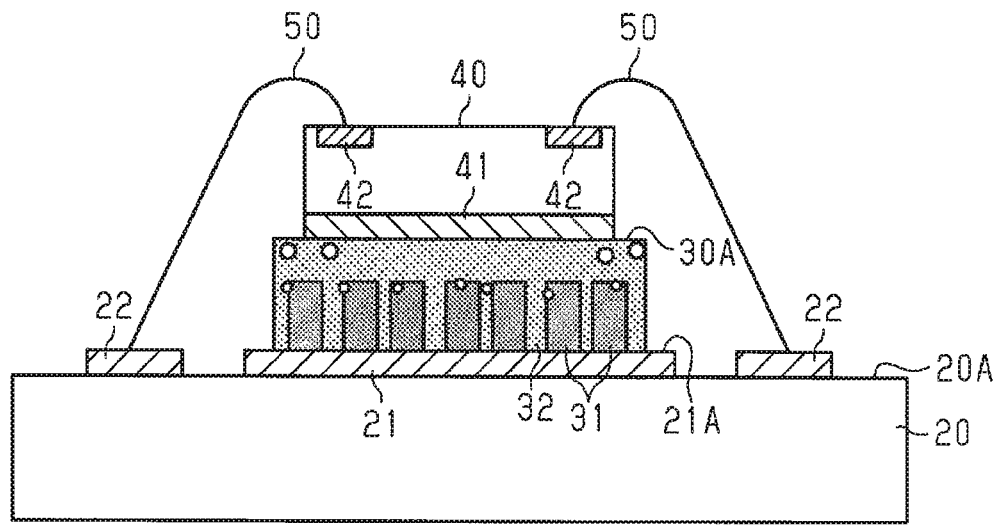
Figure 5B:
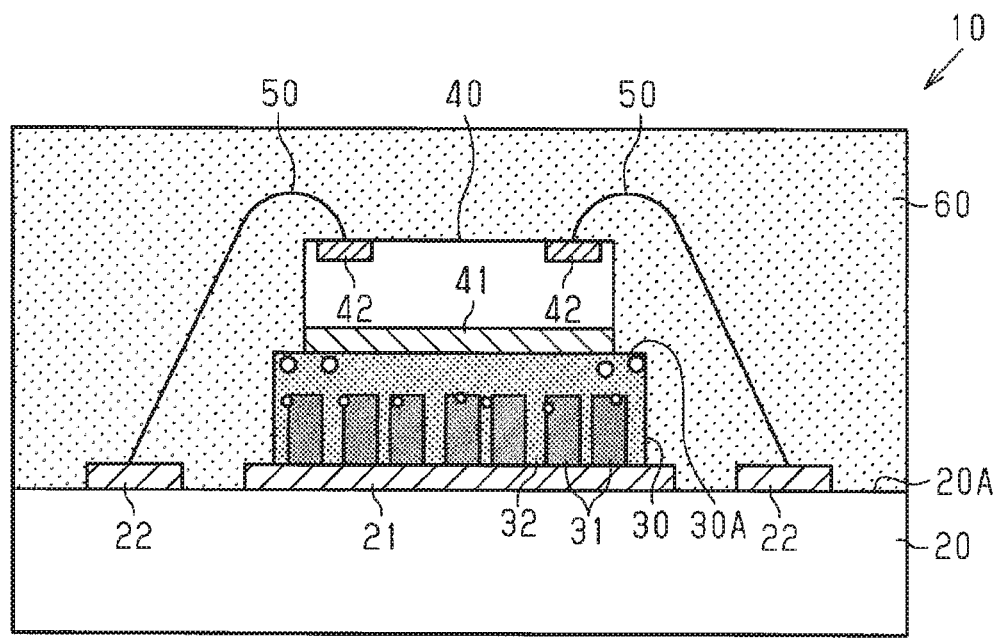

In the step illustrated in FIG. 5B, the encapsulation resin 60, which encapsulates the semiconductor element 40, is formed on the upper surface 20A of the insulative substrate 20. The encapsulation resin 60, for example, entirely covers the semiconductor element 40, the bonding portion 30, the wiring patterns 21 and 22, and the wires 50.

For example, when a thermosetting mold resin is used as the material of the encapsulation resin 60, the structure illustrated in FIG. 5A is arranged in a mold. Then, pressure (e.g., 5 to 10 MPa) is applied to fill the mold with a fluidized mold resin. The mold resin is heated to approximately 180° C. and then hardened to form the encapsulation resin 60. The method for filling the mold with the mold resin includes, for example, a transfer molding process, a compression molding process, and an injection molding process. The semiconductor device 10 is manufactured through the above described manufacturing steps.

The semiconductor device 10 in accordance with one embodiment has the advantages described as below.

(1) The sintering materials 31A are formed and distributed on the upper surface 21A of the wiring pattern 21 and sintered to form the sintered layers 31. Subsequently, the sintering material 32A is formed to cover the sintered layers 31 and sintered to form the sintered layer 32. In this manner, the sintering materials 31A and 32A are supplied and sintered in two or more stages. This avoids situations in which many voids 32X gather at the peripheral region of the bonding portion 30 and combine to form large voids. As a result, the connection reliability is improved between the electrode pad 41 of the semiconductor element 40 and the wiring pattern 21 of the insulative substrate 20.

(2) When sintering the sintering material 32A, the stress applied to the interface of the bonding portion 30 (sintered layer 32) and the electrode pad 41 of the semiconductor element 40 is reduced. As a result, the formation of cracks in the bonding portion 30 at the interface is limited. This improves the connection reliability between the electrode pad 41 of the semiconductor element 40 and the wiring pattern 21 of the insulative substrate 20.

(3) The amount of the voids 31X and 32X remaining in the bonding portion 30 may be adjusted by adjusting the number of the sintered layers 31 and the volume of each sintered layer 31.

(4) The sintered layer 32 is formed to entirely cover the upper surfaces of the sintered layers 31. Thus, compared to when the upper surfaces of the sintered layers 31 are exposed (e.g., upper surfaces of sintered layers 31 are formed to be flush with upper surface of sintered layer 32), the thickness of the sintered layer 32 may be adjusted more easily when forming the sintered layer 32. This allows for stable formation of the sintered layer 32 having the desired thickness.

It should be apparent to those skilled in the art that the foregoing embodiments may be implemented in many other specific forms without departing from the scope of this disclosure. Particularly, it should be understood that the foregoing embodiments may be implemented in the following forms.

The above embodiments and the following modifications may be combined as long as the combined modifications do not technically contradict one another.

In the above embodiment, the sintered layers 31 and the sintered layer 32 are formed from the same sintering material. However, the sintered layers 31 and the sintered layer 32 may be formed from different sintering materials. The formation of the sintered layers 31 and the sintered layer 32 with different sintering materials allows the sintered layers 31 and the sintered layer 32 to have different physical properties such as the coefficient of thermal expansion and Young's modulus.

For example, the material of the sintered layers 31 may be a silver sintering material including nickel particles, and the material of the sintered layer 32 may be a silver sintering material that does not include nickel particles. Such a structure allows the thermal expansion coefficient of the sintered layers 31 to differ from that of the sintered layer 32. In this case, grain growth of the nickel particles is limited when sintering the silver sintering material. Accordingly, nickel particles may not be included in the surface contacting the electrode pad 41 of the semiconductor element 40. Thus, in the present modified example, the sintered layer 32 may entirely cover the upper surfaces of the sintered layers 31, which include nickel particles.

Further, the material of the sintered layers 31 may be a sintering material having copper particles (copper sintering material) as a main component, and the material of the sintered layer 32 may be a silver sintering material. When the metal particles of the main component differ between the sintering materials, the thermal expansion coefficient and Young's modulus of the sintered layers 31 may differ from the thermal expansion coefficient and Young's modulus of the sintered layer 32. For example, when a copper sintering material is used as the material of the sintered layers 31, the thermal expansion coefficient of the sintered layers 31 may be set to approximate that of the insulative substrate 20 or the wiring pattern 21. In this case, the heating temperature during the first sintering process of the copper sintering material may be approximately 250° C. to 300° C., and the heating temperature during the subsequent sintering process of the silver sintering material may be approximately 180° C. to 300° C.

In the above embodiment, the sintered layer 32 entirely covers the upper surfaces of the sintered layers 31. Instead, the sintered layer 32 may be formed, for example, to entirely expose the upper surfaces of the sintered layers 31. For example, the sintered layers 31 and 32 may be formed so that the upper surfaces of the sintered layers 31 are flush with the upper surface of the sintered layer 32.

In the above embodiment, the bonding portion 30 is formed by two types of sintered layers, namely, the sintered layers 31 and 32. Instead, the bonding portion 30 may be formed by three or more types of sintered layers.

In the above embodiment, the sintering material 32A is heated during the second sintering process in a state in which the semiconductor element 40 is pressed toward the wiring pattern 21. Instead, the sintering material 32A may be sintered by performing only heating and without pressing the semiconductor element 40 toward the wiring pattern 21.

In the above embodiment, the upper surface 20A of the insulative substrate 20 includes a single semiconductor element 40 but may include more than one semiconductor element. For example, as illustrated in FIG. 6, the upper surface 20A of the insulative substrate 20 may include a plurality of the semiconductor elements 40 (three in FIG. 6). Each of the semiconductor elements 40 is connected to the corresponding wiring pattern 21 by the corresponding bonding portion 30. In this case, for example, the encapsulation resin 60 may be formed to encapsulate a plurality of semiconductor elements 40 together with a plurality of bonding portions 30.

CLAUSE

This disclosure further encompasses the following embodiment.

1. A method for manufacturing a semiconductor device, including:
    preparing an insulative substrate;
    forming a wiring pattern on an upper surface of the insulative substrate; and
    forming a bonding portion on an upper surface of the wiring pattern,
    wherein the forming a bonding portion includes
        forming first sintering materials distributed on the upper surface of the wiring pattern,
        forming first sintered layers by sintering the first sintering materials,
        forming a second sintering material on the upper surface of the wiring pattern to surround the first sintered layers,
        placing a semiconductor element on an upper surface of the second sintering material, and
        sintering the second sintering material to form a second sintered layer thereby forming the bonding portion that includes the first sintered layers and the second sintered layer and bonds the semiconductor element and the insulative substrate.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device, comprising:
    an insulative substrate;
    a wiring pattern formed on an upper surface of the insulative substrate;
    a bonding portion formed on an upper surface of the wiring pattern; and
    a semiconductor element that includes an electrode pad bonded to an upper surface of the bonding portion, wherein
    the bonding portion includes
        first sintered layers distributed in the bonding portion, and
        a second sintered layer having a density differing from that of each of the first sintered layers and surrounding the first sintered layers.

2. The semiconductor device according to claim 1, wherein
    the first sintered layers are formed on the upper surface of the wiring pattern, and
    the second sintered layer is formed on the upper surface of the wiring pattern to cover an upper surface and a side surface of each of the first sintered layers.

3. The semiconductor device according to claim 1, wherein the bonding portion has a sea-island structure in which the second sintered layer forms a sea portion and the first sintered layers form island portions.

4. The semiconductor device according to claim 1, wherein the first sintered layers and the second sintered layer are formed from the same material, and each of the first sintered layers has a higher density than the second sintered layer.

5. The semiconductor device according to claim 1, wherein the first sintered layers and the second sintered layer are formed from different materials.

6. The semiconductor device according to claim 5, wherein the first sintered layers are formed from a silver sintering material that includes nickel particles, and the second sintered layer is formed from a silver sintering material that is less nickel particles.

7. The semiconductor device according to claim 5, wherein the first sintered layers are formed from a copper sintering material, and the second sintered layer is formed from a silver sintering material.

8. The semiconductor device according to claim 1, wherein the first sintered layers are distributed in a peripheral region of the bonding portion and a central region of the bonding portion in a plan view.

9. The semiconductor device according to claim 1, wherein the first sintered layers are each circular in a plan view.

10. The semiconductor device according to claim 9, wherein the first sintered layers each have a diameter of 50 to 100 μm.

11. The semiconductor device according to claim 1, wherein the first sintered layers are each post-like.

12. The semiconductor device according to claim 1, wherein the first sintered layers each have a thickness of 10 to 60 μm, the second sintered layer surrounding the first sintered layers has a thickness of 20 to 80 μm according to the thickness of the first sintered layers.

13. The semiconductor device according to claim 1, wherein the second sintered layer fills a gap between the first sintered layers.

* * * * *